US008753462B2

(12) United States Patent
Cho et al.

(10) Patent No.: US 8,753,462 B2
(45) Date of Patent: Jun. 17, 2014

(54) METHOD OF MANUFACTURING NON-SHRINKING MULTILAYER CERAMIC SUBSTRATE

(75) Inventors: Beom Joon Cho, Yongin (KR); Eun Tae Park, Yongin (KR); Hyoung Ho Kim, Suwon (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 102 days.

(21) Appl. No.: 12/476,216

(22) Filed: Jun. 1, 2009

(65) Prior Publication Data
US 2010/0101701 A1    Apr. 29, 2010

(30) Foreign Application Priority Data
Oct. 23, 2008 (KR) .................. 10-2008-0104467

(51) Int. Cl.
*C03B 29/00* (2006.01)
(52) U.S. Cl.
USPC ..................................... 156/89.12; 156/89.11
(58) Field of Classification Search
USPC ............... 156/89.11, 89.12, 85, 153
See application file for complete search history.

(56) References Cited

U.S. PATENT DOCUMENTS

| 5,538,582 | A * | 7/1996 | Natarajan et al. .............. 156/285 |
| 5,662,755 | A * | 9/1997 | Miura et al. ................ 156/89.15 |
| 6,194,053 | B1 * | 2/2001 | Natarajan et al. .............. 428/139 |
| 6,335,077 | B1 | 1/2002 | Tani et al. |
| 6,350,334 | B1 * | 2/2002 | Shigemi et al. ............ 156/89.12 |
| 2001/0026435 | A1 * | 10/2001 | Sakai .......................... 361/306.3 |
| 2003/0000079 | A1 * | 1/2003 | Harada et al. .................... 29/830 |
| 2004/0065401 | A1 * | 4/2004 | Fasano et al. .............. 156/89.16 |
| 2006/0234021 | A1 * | 10/2006 | Tanei et al. .................... 428/210 |
| 2007/0289691 | A1 * | 12/2007 | Kim et al. .................. 156/89.12 |
| 2008/0095927 | A1 * | 4/2008 | Nanataki et al. .............. 427/100 |
| 2008/0128157 | A1 * | 6/2008 | Murata et al. .................. 174/250 |
| 2009/0110893 | A1 * | 4/2009 | Cho et al. ...................... 428/218 |
| 2009/0159179 | A1 * | 6/2009 | Park et al. .................. 156/89.11 |

FOREIGN PATENT DOCUMENTS

| JP | 2001233677 A * | 8/2001 |
| JP | 2006-269692 | 10/2006 |
| JP | 2008-004733 | 1/2008 |
| WO | WO 2007060788 A1 * | 5/2007 |

* cited by examiner

*Primary Examiner* — Philip Tucker
*Assistant Examiner* — Alex Efta
(74) *Attorney, Agent, or Firm* — McDermott Will & Emery LLP (57) ABSTRACT

Disclosed is a method of manufacturing a nonshrinking multilayer ceramic substrate. The method includes forming at least one conductive via and an electrode pattern in at least one of a plurality of ceramic green sheets, laminating the ceramic green sheets to form a ceramic laminate, selectively forming a shrinkage inhibiting thin film of sinter-resistant powder on a region including the conductive via and a periphery thereof in at least one of two surfaces of the ceramic laminate using aerosol deposition, disposing a shrinkage inhibiting green sheet for suppressing the shrinkage of the ceramic laminate on at least one of the two surfaces of the ceramic laminate including the shrinkage inhibiting thin film to form a non-sintered multilayer ceramic substrate, and sintering the non-sintered multilayer ceramic substrate.

14 Claims, 5 Drawing Sheets

PRIOR ART

FIG. 1A

PRIOR ART

METHOD OF MANUFACTURING NON-SHRINKING MULTILAYER CERAMIC SUBSTRATE

CROSS-REFERENCE TO RELATED APPLICATIONS

This application claims the priority of Korean Patent Application No. 2008-0104467 filed on Oct. 23, 2008, in the Korean Intellectual Property Office, the disclosure of which is incorporated herein by reference.

BACKGROUND OF THE INVENTION

1. Field of the Invention

The present invention relates to a method of manufacturing a non-shrinking multilayer ceramic substrate, and more particularly, to a method of manufacturing a non-shrinking multilayer ceramic substrate, which can prevent a conductive via connecting interlayer circuits from protruding and inhibit the formation of a void in a via hole in manufacturing a multilayer ceramic substrate through a non-shrinkage process.

2. Description of the Related Art

In general, a multilayer ceramic substrate employing glass-ceramic has high flexibility in terms of design because it allows the implementation of interlayer circuits having a three-dimensional structure. Multilayer ceramic substrates are increasingly utilized in the market of smaller and higher-performing high frequency components. With multilayer ceramic substrates becoming more complicated and precise, inner patterns and via structures have less margin in design and thus non-shrinkage sintering is required to suppress transverse shrinkage of the multilayer ceramic substrate.

To this end, a soluble green sheet of a sinter-resistant material, which is not sintered at a sintering temperature of a ceramic substrate material, is bonded to at least one of two surfaces of a non-sintered ceramic laminate in order to suppress the shrinkage of the ceramic laminate in the x-y direction.

However, for the electrical connection between interlayer circuits, a plurality of via holes are formed in a multilayer ceramic substrate obtained by laminating a plurality of ceramic green sheets on top of each other. The via holes are filled with a conductive electrode material.

A conductive via, formed of conductive metal powder, an organic binder and a solvent, shrinks in volume due to the sintering process. Because the conductive metal powder shrinks to a greater extent than the ceramic in the sintering process, the via hole and the conductive via are separated from each other due to the different shrinkage rates thereof, creating a large void in the via hole, even if the via hole is completely filled with the conductive electrode material before the sintering process.

Particularly, the conductive via, when sintered, shrinks in the circumferential direction and thus shrinks less in the thickness direction because of the green sheets which serve to inhibit shrinkage in the non-shrinkage process but have small shrinkage inhibiting effects on the non-sintered ceramic laminate. As a result, the conductive via becomes higher than the via hole after the sintering process, thereby protruding to the outside and creating a void in the via hole.

To prevent the formation of the void in the via hole resulting from the sintering process, the via hole may be filled with an excessive amount of conductive electrode material exceeding the volume of the via hole in the green state. However, this causes the conductive electrode material to flow over the via hole during the laminating or pressurizing process, and thus results in short circuits between layers of the substrate or the peeling of the layers, degrading the product yield.

Figure 1A:
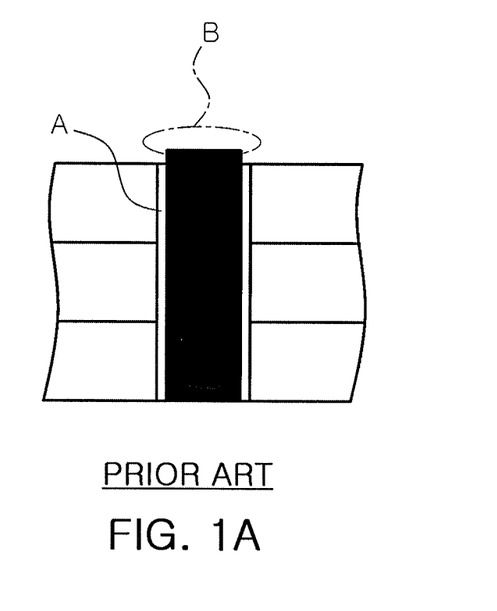
FIGS. 1A and 1B are cross-sectional views illustrating examples of defective vias generated in manufacturing a non-shrinking multilayer ceramic substrate according to the related art.
Figure 1B:
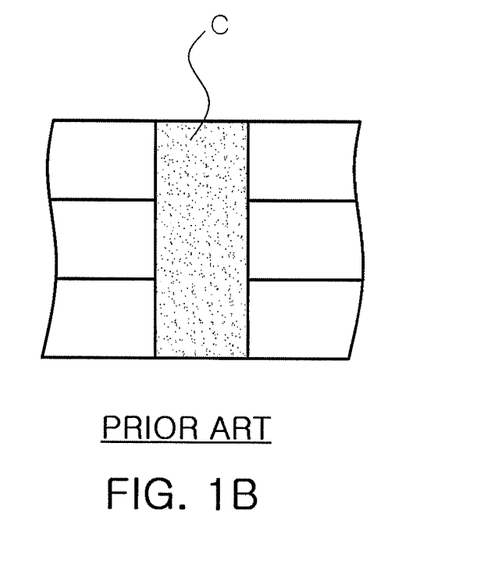

FIGS. 1A and 1B are cross-sectional views illustrating examples of defects in a conductive via after non-shrinkage sintering in the manufacturing of a non-shrinking multilayer ceramic substrate according to the related art. A non-sintered multilayer ceramic substrate may be obtained by forming via holes in ceramic green sheets through punching or the like, filling the via holes with conductive electrode paste, and then laminating and thermally compressing the ceramic green sheets. Shrinkage inhibiting green sheets made of sinter-resistant powder are bonded to two surfaces of the non-sintered multilayer ceramic substrate. Thereafter, non-shrinkage sintering is performed on the resultant structure, thereby fabricating a multilayer ceramic substrate.

In non-shrinkage sintering, the constraining force of the shrinkage inhibiting green sheet is weaker on and around the conductive via than on the ceramic green sheet. This is because the material contacting the shrinkage inhibiting green sheet in the conductive via, which breaks the continuity of the ceramic green sheet, is the conductive electrode paste of the conductive via, not a low temperature co-fired ceramic material. Consequently, defects occur around the conductive via after sintering because of the difference in shrinkage behavior in the circumferential direction.

Accordingly, as shown in FIG. 1A, a void (A) is generated in the via hole as the conductive via shrinks in the circumferential direction because of the small constraining force acting thereon from the shrinkage inhibiting green sheet. Also, the shrinkage of the conductive via is less than desired in the thickness direction due to its shrinkage in the circumferential direction. For this reason, the conductive via becomes relatively thicker than the multilayer ceramic substrate, thereby protruding above the substrate after sintering.

As for another example of the defect, as shown in FIG. 1B, sinter-resistant powder, serving to inhibit the shrinkage of the conductive via, is added to obstruct the volume shrinkage of the conductive via, so that the formation of a void can be prevented from occurring. However, since the sinter-resistant powder is used to inhibit the shrinkage of the conductive via, the low density (C) of the conductive via occurs due to an organic binder and a solvent added to the conductive electrode paste.

SUMMARY OF THE INVENTION

An aspect of the present invention provides a method of manufacturing a non-shrinking multilayer ceramic substrate, which can enhance shrinkage constraining force acting around a conductive via by forming a shrinkage inhibiting thin film tightly attached around the conductive via through an aerosol deposition method, which ensures the formation of a thin film having a high density, so that the conductive via can be physically prevented from protruding and the formation of a void in the via hole can be inhibited.

According to an aspect of the present invention, there is provided a method of manufacturing a nonshrinking multilayer ceramic substrate, the method including: forming at least one conductive via and an electrode pattern in at least one of a plurality of ceramic green sheets; laminating the ceramic green sheets on top of each other to form a ceramic laminate; selectively forming a shrinkage inhibiting thin film of sinter-resistant powder on a region including the conductive via and a periphery of the conductive via in at least one of two surfaces of the ceramic laminate using aerosol deposition; disposing a shrinkage inhibiting green sheet for suppressing the shrinkage of the ceramic laminate on at least one of the two surfaces of the ceramic laminate including the shrinkage inhibiting thin film to form a non-sintered multilayer ceramic substrate; and sintering the non-sintered multilayer ceramic substrate.

The forming of the non-sintered multilayer ceramic substrate may include disposing shrinkage inhibiting green sheets on the two surfaces of the ceramic laminate including the shrinkage inhibiting thin film, respectively. The method may further include removing the shrinkage inhibiting thin film and the shrinkage inhibiting green sheet from the sintered multilayer ceramic substrate after the sintering of the non-sintered multilayer ceramic laminate. The shrinkage inhibiting thin film and the shrinkage inhibiting green sheet may be removed from the sintered multilayer ceramic substrate using lapping, sand blasting, water washing or high-pressure spraying.

The forming of the ceramic laminate may include laminating the ceramic green sheets including the conductive via and the electrode pattern and then thermally compressing the laminated ceramic green sheets under a pressure ranging from 30 MPa to 50 MPa.

The forming of the at least one conductive via and the electrode pattern may include forming a via hole by punching using a punch, laser processing using a laser beam, or drilling using a drill.

The sinter-resistant powder may one of alumina ($Al_2O_3$), cerium dioxide ($CeO_2$), zinc peroxide ($ZnO_2$), zircornia ($ZrO_2$), magnesia ($MgO$) and boron nitride ($BN$). The sinter-resistant powder may have an average diameter ranging from 0.3 µm to 1 µm.

The selective forming of the shrinkage inhibiting thin film may include disposing a pattern mask on at least one of the two surfaces of the ceramic laminate to expose the region including the conductive via and the periphery of the conductive via, and depositing the shrinkage inhibiting thin film only on the region, exposed by the pattern mask, in the at least one of the two surfaces of the ceramic laminate. The exposed region may be a region including at least the conductive via.

The selective forming of the shrinkage inhibiting thin film may include depositing the shrinkage inhibiting thin film on the entirety of the at least one of the two surfaces of the ceramic laminate. The shrinkage inhibiting thin film may have a diameter ranging from 100 µm to 500 µm. The shrinkage inhibiting thin film may have a thickness ranging from 3 µm to 20 µm.

The sinter-resistant powder and the shrinkage inhibiting green sheet may have a sintering temperature that is higher than a sintering temperature of the ceramic laminate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

In aerosol deposition employed in the present invention, fine solid-state powder is sprayed onto a substrate so that a compact thin film with a high density can be formed on the substrate by the collision energy between the solid-state powder and the substrate.

In detail, in the aerosol deposition, a carrier gas is introduced into an aerosol chamber containing solid-state powder. The fine solid-state powder, suspending in the aerosol chamber, is carried by the carrier gas and sprayed onto the substrate disposed in a vacuum deposition chamber. A film with a high density is formed on the substrate by the collision energy between the sprayed fine solid-phase powder and the substrate.

In the process of aerosol deposition, the film formation rate reaches a few micrometers (µm) per minute, which is much faster than in an existing thin film process. Thus, the thickness of the film can be easily controlled within a range from sub-micron scales to tens of microns. Notably, the particles sprayed at high speed, up to hundreds of meters per second, cause the fine solid-state powder to collide with the substrate, having kinetic energy corresponding to the high speed. Accordingly, strong bonds may be formed between the substrate and the film, and the film may be formed evenly at a desired location without limitations in the shape of the substrate or the locations of the film. That is, the thin film formed using the aerosol deposition may be used as a shrinkage inhibiting green sheet because it can be tightly coupled with the ceramic substrate.

According to the present invention, using the aerosol deposition, a thin but tight shrinkage inhibiting thin film is formed in the limited area around a conductive via, thereby preventing defective conductive vias after non-shrinkage sintering.

Figure 2:
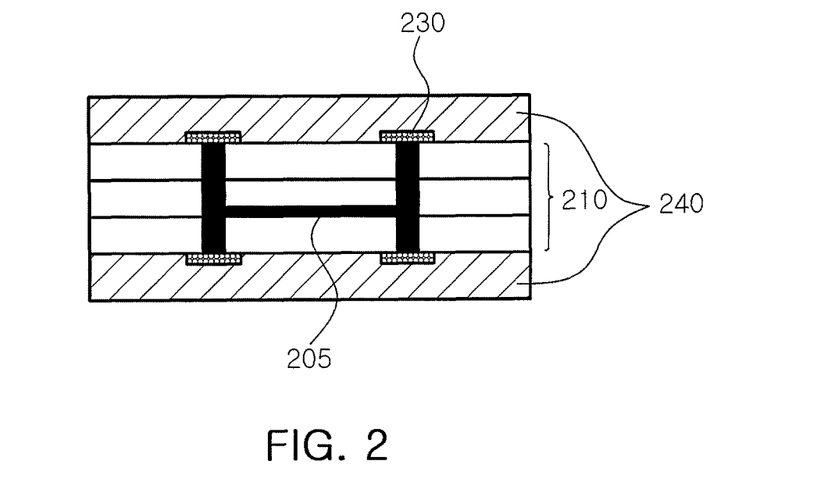
FIG. 2 is a cross-sectional view illustrating a non-sintered multilayer ceramic substrate including shrinkage inhibiting green sheets and shrinkage inhibiting thin layers in the process of manufacturing a non-shrinking multilayer ceramic substrate according to an exemplary embodiment of the present invention.

FIG. 2 is a cross-sectional view of a non-sintered multilayer ceramic substrate including shrinkage inhibiting green sheets and shrinkage inhibiting thin films in the process of manufacturing a non-shrinking multilayer ceramic substrate according to an exemplary embodiment of the present invention.

As shown in FIG. 2, a non-sintered multilayer ceramic substrate according the current embodiment includes a ceramic laminate 210 formed by laminating a plurality of ceramic green sheets on which conductive vias 203 and an electrode pattern 205 are formed, shrinkage inhibiting thin films 230 serving to enhance the constraining force on and around the conductive vias 203, and a shrinkage inhibiting green sheets 240 for non-shrinkage sintering of the ceramic laminate 210.

The shrinkage inhibiting thin film 230 needs to have a constraining force when applied on the conductive via 203 and the periphery thereof. To this end, the shrinkage inhibiting thin film 230 needs to have a greater diameter than the conductive via 203. Here, the diameter of the shrinkage inhibiting thin film 230 ranges from at least 100 μm to 500 μm. Also, the shrinkage inhibiting thin film 230 needs to be thick enough to provide the constraining force while being thin enough not to hinder the bonding of the outermost shrinkage inhibiting layer. Therefore, the shrinkage inhibiting thin film 230 may have a thickness ranging from 3 μm to 20 μm.

The shrinkage inhibiting thin film 230 is deposited on at least one of two surfaces of the ceramic laminate 210 by spraying sinter-resistant powder through the aerosol deposition. In such a manner, the shrinkage inhibiting thin film 230 is deposited densely on the ceramic laminate 210b with almost no voids, even before the sintering process, and is bonded to the surface of the ceramic laminate 210 with a strong bonding force, thereby physically preventing a conductive via from protruding in the process of sintering.

According to an aspect of the present invention, a method of manufacturing a nonshrinking multilayer ceramic substrate includes: forming at least one conductive via and an electrode pattern in at least one of a plurality of ceramic green sheets; laminating the ceramic green sheets on top of each other to form a ceramic laminate; selectively forming a shrinkage inhibiting thin film of sinter-resistant powder on a region including the conductive via and a periphery of the conductive via in at least one of two surfaces of the ceramic laminate using aerosol deposition; disposing a shrinkage inhibiting green sheet for suppressing the shrinkage of the ceramic laminate on at least one of the two surfaces of the ceramic laminate including the shrinkage inhibiting thin film to form a non-sintered multilayer ceramic substrate; and sintering the non-sintered multilayer ceramic substrate.

The selective forming of the shrinkage inhibiting thin film includes disposing a pattern mask on at least one of the two surfaces of the ceramic laminate to expose the region including the conductive via and the periphery of the conductive via, and depositing the shrinkage inhibiting thin film only on the region, exposed by the pattern mask, in the at least one of the two surfaces of the ceramic laminate. The exposed region may include at least the conductive via.

FIGS. 3 through 8 are cross-sectional views for explaining a method of manufacturing a non-shrinkage multilayer ceramic substrate according to an exemplary embodiment of the present invention.

Figure 3:
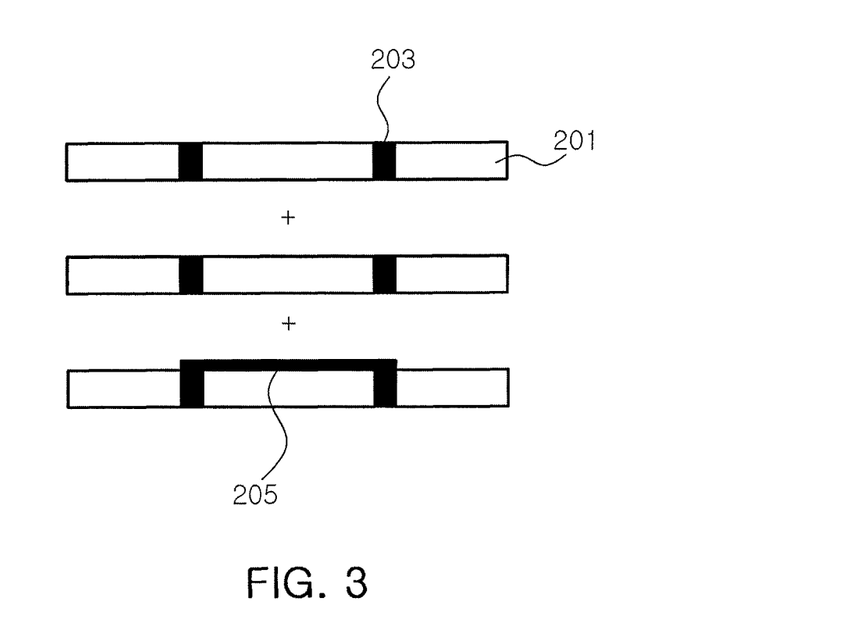
FIGS. 3 through 8 are cross-sectional views for explaining a method of manufacturing a non-shrinking multilayer ceramic substrate according to an exemplary embodiment of the present invention.

As shown in FIG. 3, conductive vias 203 and/or an electrode pattern 205 are formed in at least one of the plurality of ceramic green sheets 201. The ceramic green sheet 201 is prepared by the following manufacturing process. First, a predetermined resin, a dispersing agent and a mixture solvent are added to glass-ceramic powder. The glass-ceramic powder may be dispersed by adding a predetermined amount of dispersing agent. An acryl-based resin may be used as the predetermined resin, and toluene and ethanol may be used as the mixture solvent.

The resultant mixed solution is dispersed by a ball mill to produce slurry. The slurry is filtered and deareated, and a ceramic green sheet having a desired thickness is formed using doctor blading. The ceramic green sheet is cut to a predetermined size, and desired printed circuit patterns, such as a via hole and an electrode pattern, are formed. After the via hole is formed in each ceramic green sheet, the via hole is filled with conductive paste by screen printing.

Figure 4:
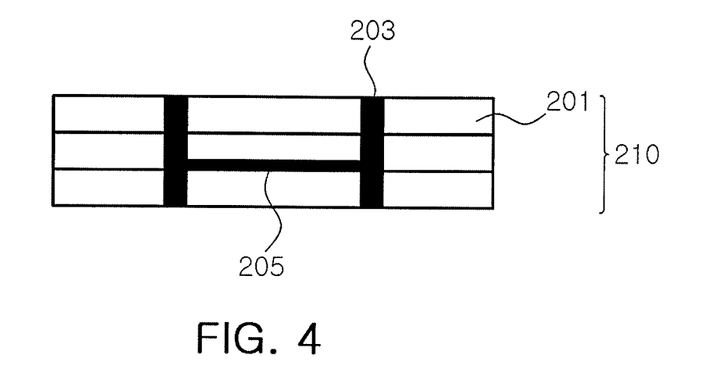

As shown in FIG. 4, the ceramic green sheets 201 including the conductive vias 203 and/or the electrode pattern 205 are laminated on one another and thermally compressed, thereby forming a ceramic laminate 210.

Figure 5:
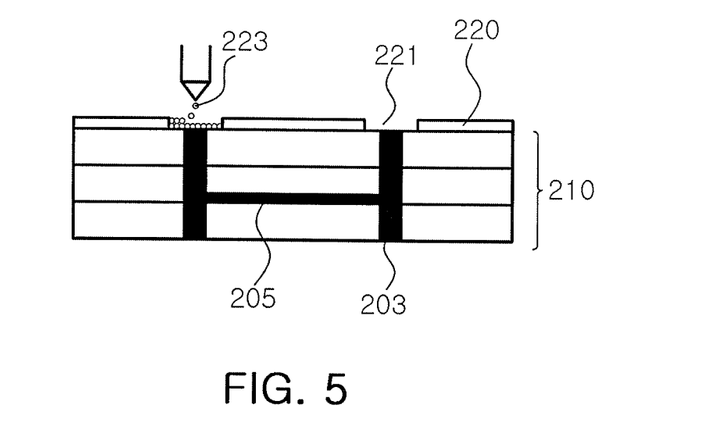

Thereafter, as shown in FIG. 5, a shrinkage inhibiting thin film is formed on one surface of the ceramic laminate 201 using the aerosol deposition. In detail, a pattern mask 220 is mounted to allow the shrinkage inhibiting thin film to be deposited only on the required part 221 of the ceramic laminate 210, that is, to expose a region covering at least the via hole 203 and the periphery of the conductive via 203. Thereafter, sinter-resistant powder 223 is deposited on the conductive via 203 and the periphery thereof using the aerosol deposition. The sinter-resistant powder 223 is not sintered at a temperature of 900° C. or lower, which is a general sintering temperature of a low temperature co-fired ceramic (LTCC), and may be one selected from the group consisting of alumina ($Al_2O_3$), cerium dioxide ($CeO_2$), zinc peroxide ($ZnO_2$), zirconia ($ZrO_2$), magnesia (MgO) and boron nitride (BN). Particularly, alumina, which is the same metal powder as a basic material, may be used. The sinter-resistant powder 223 may have an average diameter ranging from 0.3 μm to 1 μm.

To harden the surface of the ceramic laminate 210 directly colliding with the sinter-resistant powder 223, the sinter-resistant powder 223 may be deposited after the ceramic laminate 210 has been compressed under a pressure of 50 MPa or higher in advance. This is to prevent the surface of the ceramic laminate 210 from being damaged by the kinetic energy of the sinter-resistant powder 223 colliding with the ceramic laminate 210.

Figure 6:
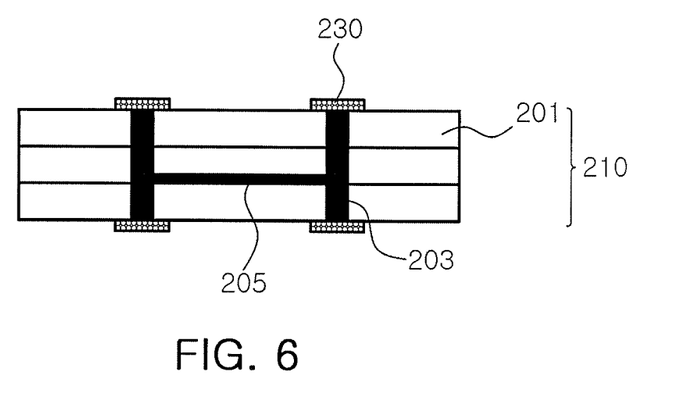

Accordingly, as shown in FIG. 6, the sinter-resistant powder 223, which meets the aforementioned condition, is deposited on the region including at least the conductive via 203 in at least one of two surfaces of the ceramic laminate 210 by using the aerosol deposition, thereby forming the shrinkage inhibiting thin film 230. However, the shrinkage inhibiting thin film 230 of the present invention is not limited to the description, and may be formed on the entirety of at least one of the two surfaces of the ceramic laminate 210.

Figure 7:
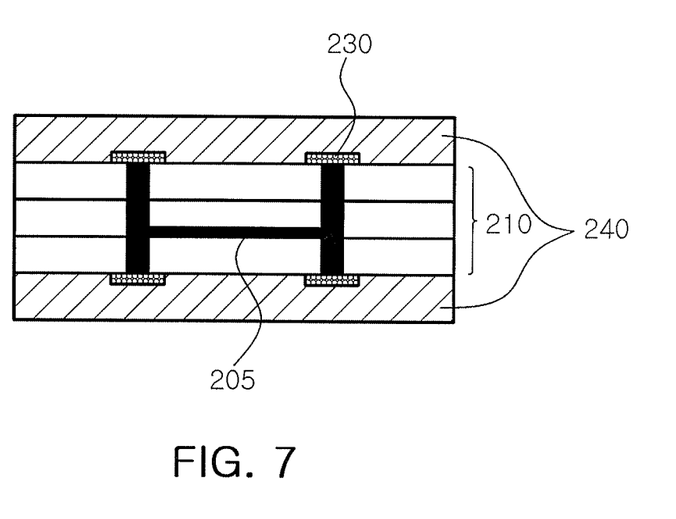

Thereafter, as shown in FIG. 7, a shrinkage inhibiting green sheet 240 for suppressing shrinkage in the circumferential direction is bonded to at least one of the two surfaces of the ceramic laminate 210 including the shrinkage inhibiting thin film 230. Like the shrinkage inhibiting thin film 230, the shrinkage inhibiting green sheet 240 is a shrinkage inhibiting ceramic green sheet containing sinter-resistant powder that is not sintered at a temperature of 900° C., the general sintering temperature of an LTCC.

The non-sintered multilayer ceramic substrate, where the shrinkage inhibiting thin film 230 and the shrinkage inhibiting green sheet 240 are formed on at least one of the two surfaces of the ceramic laminate 210, is sintered at a sintering temperature of 870° C. for an hour. The shrinkage inhibiting green sheets 240 constrain the entire top and bottom of the ceramic laminate 210. Also, the shrinkage inhibiting thin film 230, densely formed on the conductive via 203 and the periphery thereof in the ceramic laminate 210, inhibits the shrinkage of the conductive via.

The shrinkage inhibiting thin film 230, tightly formed without voids using the aerosol deposition before the process of sintering, physically prevents the conductive via from protruding.

Figure 8:
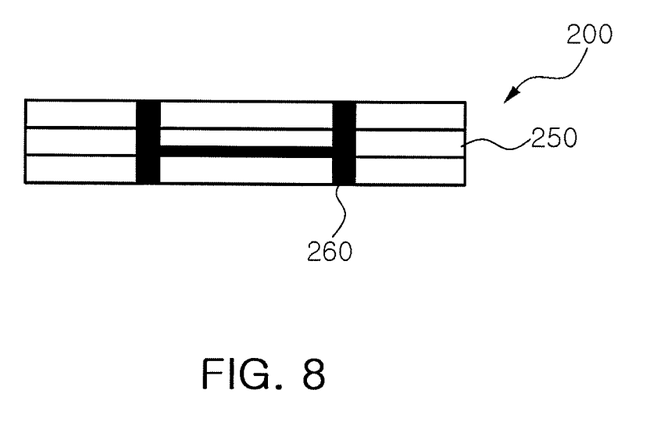

As shown in FIG. 8, a multilayer ceramic substrate 200 is completed in which the shrinkage inhibiting thin film, formed on the conductive via and the periphery thereof, prevents the formation of a void in an interface between the conductive via 260 and a sintered ceramic body 250 and suppresses the protrusion of the conductive via after the process of firing.

As described below, a non-shrinking multilayer ceramic substrate was manufactured by depositing shrinkage inhibiting thin films on both surfaces of a ceramic laminate using the aerosol deposition under the condition of the present invention, and then performing the sintering process thereon.

[Manufacturing of a Ceramic Laminate]

To prepare a low-k ceramic green sheet constituting a ceramic laminate, an acryl-based binder and a dispersing agent were added at 15 wt % and 0.5 wt % to 100% of glass-ceramic powder respectively, and a mixture solvent of toluene and ethanol was added thereto. Thereafter, the resultant solution was dispersed using a ball mill.

A slurry obtained in the above manner was filtered and deareated, and then a ceramic green sheet, having a thickness of 100 μm, was molded using doctor blading. Thereafter, the ceramic green sheet was cut in a predetermined size and punched to form a via hole with a diameter of 120 μm. The via hole of the ceramic green sheet was filled with conductive electrode paste using screen printing, thereby forming a conductive via and an electrode pattern. Thereafter, a plurality of green sheets including the conductive vias and the electrode pattern were laminated on top of each other and then thermally compressed, thereby fabricating an integrated ceramic laminate.

[Deposition of Shrinkage Inhibiting Thin Film]

Thereafter, a pattern mask was mounted such that a shrinkage inhibiting thin film could be deposited only on the required part of two surfaces of the ceramic laminate, and then, alumina, sinter-resistant powder, was sprayed using the aerosol deposition, thereby forming a shrinkage inhibiting thin film on the conductive via and periphery there of. The average diameter of alumina ranged from 0.3 μm to 1 μm. The ceramic laminate was compressed in advance under a pressure of 50 MPa or higher in order to harden the surface of the ceramic laminate directly colliding with the alumina powder.

[Bonding Between Ceramic Laminate and Shrinkage Inhibiting Green Sheet]

Shrinkage inhibiting green sheets, having a thickness of 200 μm and the same area as the ceramic laminate, were bonded onto the two surfaces of the ceramic laminate including the shrinkage inhibiting thin film formed of alumina powder on the conductive via and the periphery thereof, respectively. Thereafter, the resultant structure was thermally compressed, thereby fabricating an integrated non-sintered multilayer ceramic substrate. The shrinkage inhibiting green sheets were bonded to the two surfaces of the ceramic laminate respectively, preventing the ceramic laminate from shrinking in the circumferential direction during the sintering process.

[Sintering]

The non-sintered multilayer ceramic substrate, where the bonding of the shrinkage inhibiting green sheets with the ceramic laminate had been completed, was sintered at a sintering temperature of 870° C. for an hour. Thereafter, the shrinkage inhibiting green sheets were removed from the resultant sintered structure. That is, after the non-sintered multilayer ceramic substrate was sintered, the shrinkage inhibiting green sheets on the two surfaces of the sintered structure, and the shrinkage inhibiting thin film on the conductive via and the periphery thereof, remained non-sintered. Thus, the remaining shrinkage inhibiting thin film and green sheets were removed from the surface of the sintered structure using water washing, ultrasonic washing, sand blasting or high-pressure spraying.

Consequently, the shrinkage inhibiting green sheets constrain the entire top and bottom of the ceramic laminate, and the dense shrinkage inhibiting thin film suppresses the shrinkage of the conductive via and the periphery of the conductive via in the ceramic laminate. The shrinkage inhibiting thin film formed using the aerosol deposition is densely disposed with almost no voids even before the sintering process, thereby physically preventing the conductive via from protruding. Accordingly, a multilayer ceramic substrate can be obtained, in which, after the sintering process, there is no void in the via hole and the conductive via does not protrude.

According to the present invention, the sinter-resistant solid-state powder is densely attached to the conductive via and the periphery of the conductive via, the constraining force of which is weakened at the time of the process of non-shrinkage sintering. Accordingly, the shrinkage constraining force on the conductive via and the periphery thereof is enhanced, thereby preventing the formation of a void in the via hole and also preventing the conductive via from protruding due to the shrinkage of the conductive via in the circumferential direction. Thus, interlay short-circuits and open fails caused in filling the via hole can be prevented.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a nonshrinking multilayer ceramic substrate, the method comprising:
   forming at least one conductive via to penetrate through the multilayer ceramic substrate and an electrode pattern in at least one of a plurality of ceramic green sheets;
   laminating the ceramic green sheets on top of each other to form a ceramic laminate;
   selectively forming a shrinkage inhibiting thin film of sinter-resistant powder directly on the conductive via and a periphery of the conductive via on at least one of two outer surfaces of the ceramic laminate using aerosol deposition;
   disposing a shrinkage inhibiting green sheet for suppressing the shrinkage of the ceramic laminate on the at least one of two outer surfaces of the ceramic laminate including the shrinkage inhibiting thin film formed of alumina powder on the conductive via and the periphery thereof to form a non-sintered multilayer ceramic substrate; and
   sintering the non-sintered multilayer ceramic substrate,
   wherein the shrinkage inhibiting thin film is formed selectively on the at least one of two outer surfaces without covering the entire at least one of two surfaces;
   wherein the shrinkage inhibiting green sheet covers the entirety of the at least one of two outer surfaces of the ceramic laminate and contacts the ceramic laminate; and
   wherein the sinter-resistant powder and the shrinkage inhibiting green sheet have a higher sintering temperature than that of the ceramic laminate.

2. The method of claim 1, wherein the forming of the non-sintered multilayer ceramic substrate comprises disposing shrinkage inhibiting green sheets on the two surfaces of the ceramic laminate including the shrinkage inhibiting thin film, respectively.

3. The method of claim 1, further comprising removing the shrinkage inhibiting thin film and the shrinkage inhibiting green sheet from the sintered multilayer ceramic substrate after the sintering of the non-sintered multilayer ceramic laminate.

4. The method of claim 3, wherein the shrinkage inhibiting thin film and the shrinkage inhibiting green sheet are removed from the sintered multilayer ceramic substrate using lapping, sand blasting, water washing or high-pressure spraying.

5. The method of claim 1, wherein the forming of the ceramic laminate comprises laminating the ceramic green sheets including the conductive via and the electrode pattern and then thermally compressing the laminated ceramic green sheets under a pressure ranging from 30 MPa to 50 MPa.

6. The method of claim 1, wherein the forming of the at least one conductive via and the electrode pattern comprises forming a via hole by punching using a punch, laser processing using a laser beam, or drilling using a drill.

7. The method of claim 1, wherein the sinter-resistant powder is one of alumina ($Al_2O_3$), cerium dioxide ($CeO_2$), zinc peroxide ($ZnO_2$), zircornia ($ZrO_2$), magnesia ($MgO$) and boron nitride ($BN$).

8. The method of claim 7, wherein the sinter-resistant powder has an average diameter ranging from 0.3 μm to 1 μm.

9. The method of claim 1, wherein the selective forming of the shrinkage inhibiting thin film comprises disposing a pattern mask on at least one of the two surfaces of the ceramic laminate to expose the region including the conductive via and the periphery of the conductive via, and depositing the shrinkage inhibiting thin film only on the region, exposed by the pattern mask, on the at least one of the two surfaces of the ceramic laminate.

10. The method of claim 9, wherein the exposed region is a region including at least the conductive via.

11. The method of claim 1, wherein the selective forming of the shrinkage inhibiting thin film comprises depositing the shrinkage inhibiting thin film on the entirety of the at least one of the two surfaces of the ceramic laminate.

12. The method of claim 1, wherein the shrinkage inhibiting thin film has a diameter ranging from 100 μm to 500 μm.

13. The method of claim 1, wherein the shrinkage inhibiting thin film has a thickness ranging from 3 μm to 20 μm.

14. The method of claim 1, further comprising:
forming a second conductive via in the at least one of the plurality of ceramic green sheets;
selectively forming a second shrinkage inhibiting thin film on a second region including the second conductive via and a periphery of the second conductive via on the at least one of two surfaces of the ceramic laminate,
wherein the second shrinkage inhibiting thin film is separate from the shrinkage inhibiting thin film.

* * * * *